(12) United States Patent
Li

(10) Patent No.: US 7,928,433 B2
(45) Date of Patent: *Apr. 19, 2011

(54) ELECTRONIC DEVICE COMPRISING SEMICONDUCTING POLYMERS

(75) Inventor: Yuning Li, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 326 days.

This patent is subject to a terminal disclaimer.

(21) Appl. No.: 12/193,189

(22) Filed: Aug. 18, 2008

(65) Prior Publication Data
US 2010/0038631 A1 Feb. 18, 2010

(51) Int. Cl.
H01L 51/30 (2006.01)
C08G 73/08 (2006.01)

(52) U.S. Cl. ........... 257/40; 257/E51.029; 257/E51.036; 528/380; 528/403; 528/423

(58) Field of Classification Search ........ 257/40, 257/E51.001–E51.052, 103; 438/99, 82; 313/504; 428/690, 917; 525/24; 528/367, 528/373, 377–380, 403, 423
See application file for complete search history.

(56) References Cited

U.S. PATENT DOCUMENTS

| 3,238,183 | A | 3/1966 | Frazer |
| 3,357,956 | A | 12/1967 | Frazer |
| 3,385,837 | A | 5/1968 | Fitzgerald et al. |
| 3,476,719 | A | 11/1969 | August et al. |
| 6,476,184 | B1 * | 11/2002 | Janietz et al. ............... 528/422 |
| 6,864,352 | B2 * | 3/2005 | Wang et al. ............... 528/423 |
| 7,105,633 | B2 * | 9/2006 | Wang et al. ............... 528/491 |
| 7,431,996 | B2 * | 10/2008 | Iwasaki et al. ............... 428/690 |
| 7,758,757 | B2 * | 7/2010 | Lee ............... 210/691 |
| 2006/0006379 | A1 * | 1/2006 | Lee et al. ............... 257/40 |
| 2007/0228359 | A1 * | 10/2007 | Heim et al. ............... 257/40 |
| 2010/0041861 | A1 * | 2/2010 | Li ............... 528/367 |

FOREIGN PATENT DOCUMENTS

FR 1459375 A 4/1966
WO 0177203 A2 10/2001

OTHER PUBLICATIONS

Schulz, B. et al. "Aromatic Poly (1,3,4-oxadiazole)s as Advanced Materials." Adv. Mater., vol. 9, No. 8 (1997): pp. 601-613.*

(Continued)

Primary Examiner — Matthew W Such
(74) Attorney, Agent, or Firm — Fay Sharpe LLP

(57) ABSTRACT

An electronic device comprises a semiconducting polymer of Formula (I):

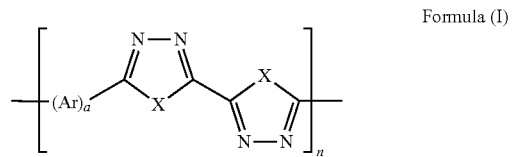

wherein X is independently selected from S, Se, O, and NR, wherein R is independently selected from hydrogen, alkyl, substituted alkyl, aryl, substituted aryl, heteroaryl, and —CN; Ar is independently a conjugated divalent moiety;
a is an integer from 1 to about 10; and
n is an integer from 2 to about 5,000.
The electronic device may be an organic thin film transistor.

17 Claims, 1 Drawing Sheet

OTHER PUBLICATIONS

Pei et al., "1,3,4-Oxadiazole-Containing Polymers as Electron-Injection and Blue Electroluminescent Materials in Polymer Light-Emitting Diodes", Chemistry of Materials, American Chemical Society, Washington, Aug. 1, 1995, pp. 1568-1575.

Bochvar et al., "The Synthesis and a Comparative Experimental and Theoretical Study of Poly-1,3,4-oxadiazoles", Polymer Science U.S.S.R., Pergamon, Jan. 1, 1967, pp. 1598-1604.

Saga et al., "Polycondensation of Oxalamidrazone with Dicarboxylic Acid Chlorides", Journal of Polymer Science, Polymer Letters Edition, Wiley, Jan. 1, 1966, pp. 869-873.

Lofgren et al., "Electric and Dielectric Properties of Metal Chelates of an Aromatic Polyhydrazide", Angewandte Makromolekulare Chemie. Applied Macromolecularchemistry and Physics, Wiley VCH, Weinheim DE, Jan. 8, 1976, pp. 1-8.

European Search Report dated Dec. 29, 2009.

"Electron transport with mobility above $10^{-3}$ $cm^2/Vs$ in amorphous film of co-planar bipyridyl-substituted oxadiazole," Musuba Ichikawa et al., phys. stat. sol. (RRL) 1, No. 1 R37-39 (2007), 3 pgs.

"n-Type Copolymers with Fluorene and 1,3,4-Heterodiazole Moieties," Silvia Janietz et al., Macromol. Chem. Phys. 2004, 205, 187-198.

"Tuning Orbital Energetics in Arylene Diimide Semiconductors. Materials Design for Ambient Stability of n-Type Charge Transport," Brooks A. Jones et al., J. Am. Chem. Soc. 2007, 129, 15259-15278.

"Oxidiazoles and phenylquinoxalines as electron transport materials," J. Bettenhausen et al., Synthetic Metals 91 (1997) 223-228.

* cited by examiner

ELECTRONIC DEVICE COMPRISING SEMICONDUCTING POLYMERS

BACKGROUND

The present disclosure relates, in various embodiments, to compositions and processes suitable for use in electronic devices, such as thin film transistors ("TFT"s). The present disclosure also relates to components or layers produced using such compositions and processes, as well as electronic devices containing such materials.

Thin film transistors (TFTs) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. It is generally desired to make TFTs which have not only much lower manufacturing costs, but also appealing mechanical properties such as being physically compact, lightweight, and flexible. Organic thin film transistors (OTFTs) may be suited for those applications not needing high switching speeds or high densities.

TFTs are generally composed of a supporting substrate, three electrically conductive electrodes (gate, source and drain electrodes), a channel semiconducting layer, and an electrically insulating gate dielectric layer separating the gate electrode from the semiconducting layer.

It is desirable to improve the performance of known TFTs. Performance can be measured by at least three properties: the mobility, current on/off ratio, and threshold voltage. The mobility is measured in units of cm$^2$/V·sec; higher mobility is desired. A higher current on/off ratio is desired. Threshold voltage relates to the bias voltage needed to be applied to the gate electrode in order to allow current to flow. Generally, a threshold voltage as close to zero (0) as possible is desired.

While p-type semiconducting materials have been extensively researched, less emphasis has been applied to n-type semiconducting materials. N-type organic semiconductors having high electron mobility and stability in air, especially solution processable n-type semiconductors, are rare due to their air sensitivity and difficulties in synthesis compared to p-type semiconductors. Because n-type semiconductors transport electrons instead of holes, they require a low Lowest Unoccupied Molecular Orbital (LUMO) energy level. To achieve low LUMO levels, electron-withdrawing groups such as fluoroalkyl, cyano, acyl, or imide groups have been applied to some n-type organic semiconductors. However these electron-withdrawing groups can only be used as substituents or sidechains on conjugated cores such as acenes, phthalocyanines, and oligothiophenes, and cannot be used as conjugated divalent linkages themselves for constructing linear n-type semiconducting polymers. Most reported high-mobility air-stable n-type semiconductors are small molecular compounds and can only be processed using expensive vacuum deposition techniques to achieve maximum performance.

BRIEF DESCRIPTION

The present disclosure is directed, in various embodiments, to semiconducting polymers and to electronic devices, such as thin film transistors, having a semiconducting layer comprising the semiconducting polymer. The semiconducting polymers are n-type or both n-type and p-type semiconducting materials that are stable in air and have high mobility.

In embodiments is disclosed an electronic device comprising a semiconducting layer, the semiconducting layer comprising a semiconducting polymer of Formula (I):

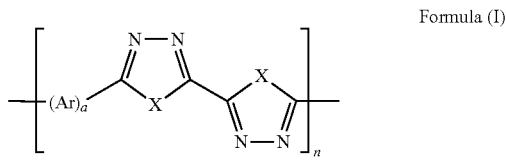

Formula (I)

wherein X is independently selected from S, Se, O, and NR, wherein R is independently selected from hydrogen, alkyl, substituted alkyl, aryl, substituted aryl, heteroaryl, and —CN; Ar is independently a conjugated divalent moiety; a is an integer of from 1 to about 10; and n is an integer from 2 to about 5,000.

Each Ar is a conjugated divalent moiety selected from

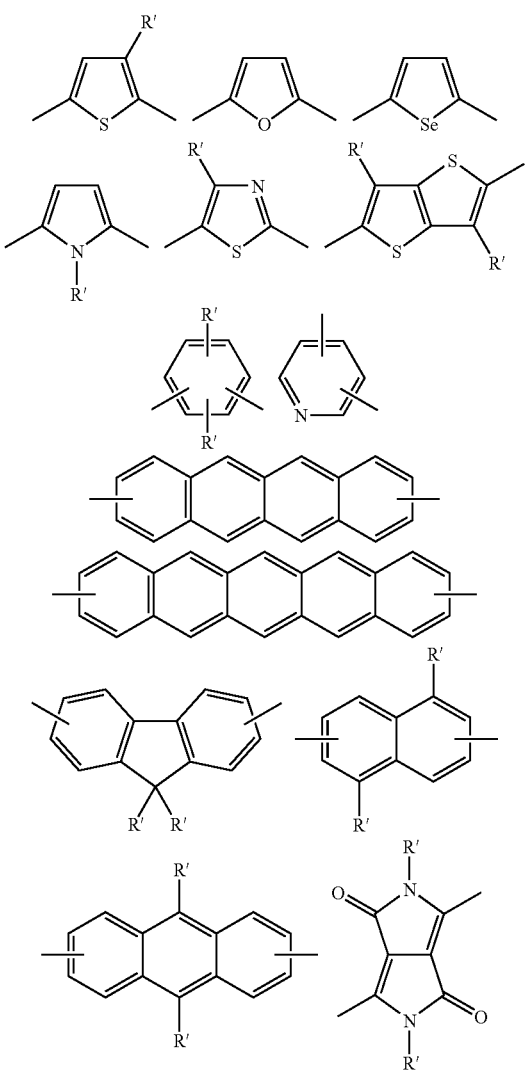

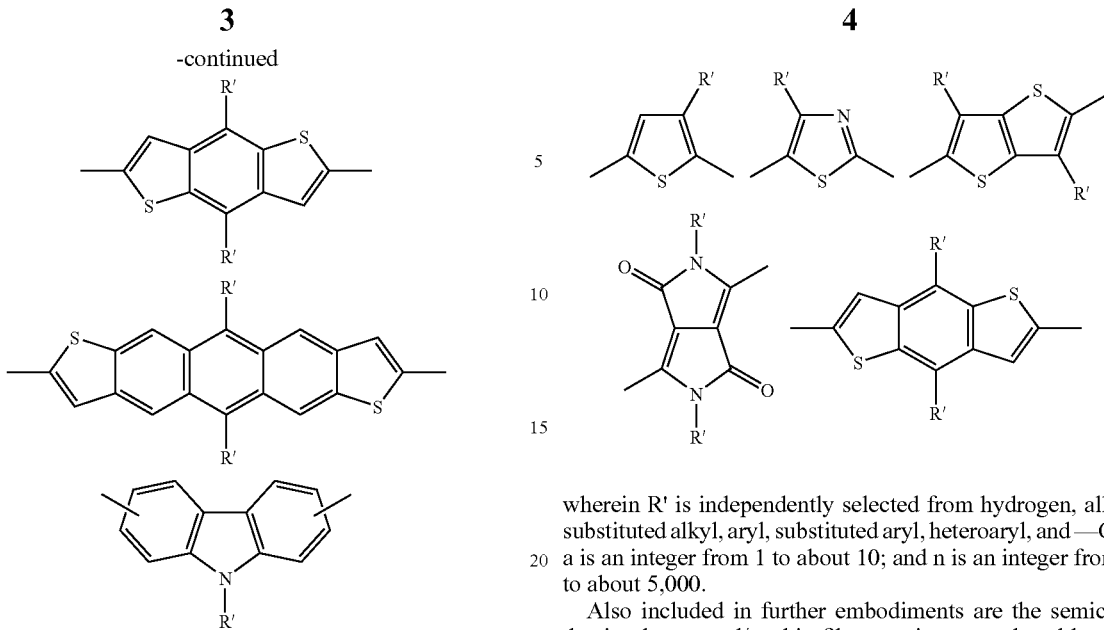

wherein R' is independently selected from hydrogen, alkyl, substituted alkyl, aryl, substituted aryl, heteroaryl, —CN, and the like, or mixtures thereof. In specific embodiments, R' is alkyl. The conjugated divalent moiety Ar may be substituted once, twice, or multiple times where applicable, with alkyl, substituted alkyl, aryl, substituted aryl, heteroaryl, halogen, —CN, —NO$_2$, and the like, or mixtures thereof.

The semiconducting polymer may have a LUMO of 3.5 eV or less, or 4.0 eV or less, or 4.5 eV or less, against vacuum.

In some embodiments, Ar may be

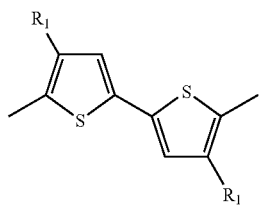

wherein $R_1$ is an alkyl group having 1 to about 18 carbon atoms, or an aryl or a heteroaryl group having from about 5 to about 20 carbon atoms In other embodiments, the semiconducting layer of an electronic device comprises a semiconducting polymer of Formula (I):

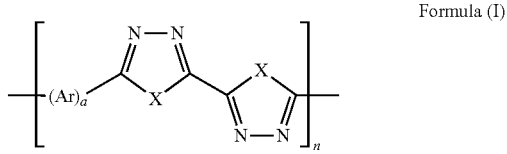

Formula (I)

wherein X is independently selected from S, Se, O, and NR, wherein R is independently selected from hydrogen, alkyl, substituted alkyl, aryl, substituted aryl, heteroaryl, and —CN; each Ar moiety is independently selected from:

wherein R' is independently selected from hydrogen, alkyl, substituted alkyl, aryl, substituted aryl, heteroaryl, and —CN; a is an integer from 1 to about 10; and n is an integer from 2 to about 5,000.

Also included in further embodiments are the semiconducting layers and/or thin film transistors produced by this process.

These and other non-limiting characteristics of the exemplary embodiments of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
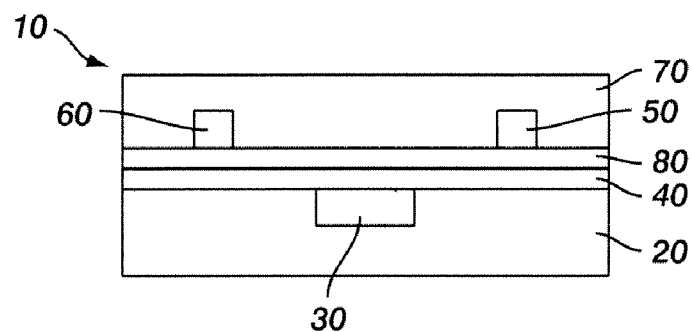
FIG. 1 is a first exemplary embodiment of a TFT of the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

The present disclosure relates to semiconducting polymers of Formula (I), as further described below. These semiconducting polymers are particularly suitable for use in the semiconducting layer of an electronic device, such as a thin-film transistor or organic thin-film transistor (OTFT). Such transistors may have many different configurations.

FIG. 1 illustrates a first OTFT embodiment or configuration. The OTFT 10 comprises a substrate 20 in contact with the gate electrode 30 and a dielectric layer 40. Although here the gate electrode 30 is depicted within the substrate 20, this is not required. However, of some importance is that the dielectric layer 40 separates the gate electrode 30 from the source electrode 50, drain electrode 60, and the semiconducting layer 70. The source electrode 50 contacts the semiconducting layer 70. The drain electrode 60 also contacts the semiconducting layer 70. The semiconducting layer 70 runs over and between the source and drain electrodes 50 and 60. Optional interfacial layer 80 is located between dielectric layer 40 and semiconducting layer 70.

Figure 2:
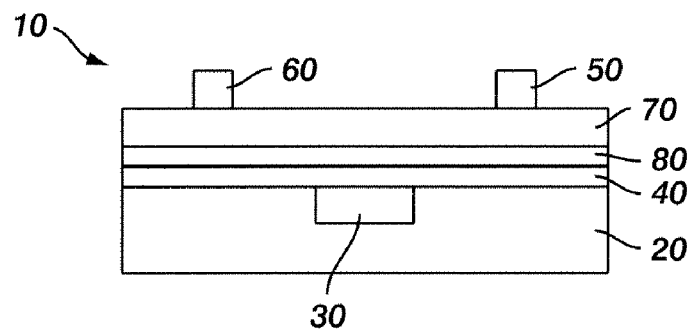
FIG. 2 is a second exemplary embodiment of a TFT of the present disclosure.

FIG. 2 illustrates a second OTFT embodiment or configuration. The OTFT 10 comprises a substrate 20 in contact with the gate electrode 30 and a dielectric layer 40. The semiconducting layer 70 is placed over or on top of the dielectric layer 40 and separates it from the source and drain electrodes 50 and 60. Optional interfacial layer 80 is located between dielectric layer 40 and semiconducting layer 70.

Figure 3:
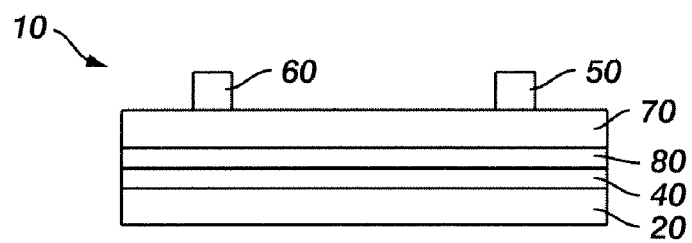
FIG. 3 is a third exemplary embodiment of a TFT of the present disclosure.

FIG. 3 illustrates a third OTFT embodiment or configuration. The OTFT 10 comprises a substrate 20 which also acts as the gate electrode and is in contact with a dielectric layer 40. The semiconducting layer 70 is placed over or on top of the dielectric layer 40 and separates it from the source and drain electrodes 50 and 60. Optional interfacial layer 80 is located between dielectric layer 40 and semiconducting layer 70.

Figure 4:
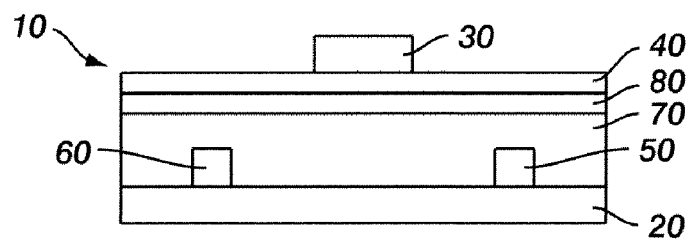
FIG. 4 is a fourth exemplary embodiment of a TFT of the present disclosure.

FIG. 4 illustrates a fourth OTFT embodiment or configuration. The OTFT 10 comprises a substrate 20 in contact with the source electrode 50, drain electrode 60, and the semiconducting layer 70. The semiconducting layer 70 runs over and between the source and drain electrodes 50 and 60. The dielectric layer 40 is on top of the semiconducting layer 70. The gate electrode 30 is on top of the dielectric layer 40 and does not contact the semiconducting layer 70. Optional interfacial layer 80 is located between dielectric layer 40 and semiconducting layer 70.

In embodiments, the semiconducting layer of the electronic device comprises a semiconducting polymer of Formula (I):

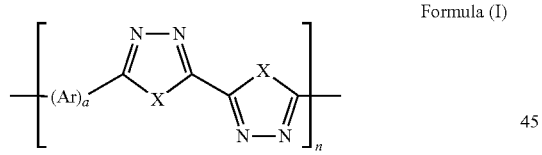

Formula (I)

wherein X is independently selected from S, Se, O, and NR, wherein R is independently selected from hydrogen, alkyl, substituted alkyl, aryl, substituted aryl, heteroaryl, and —CN; Ar is independently a conjugated divalent moiety; a is an integer of from 1 to about 10; and n is an integer from 2 to about 5,000.

In particular embodiments, X is independently selected from S and O. When X is sulfur, the semiconducting material may be considered a bithiadiazole material. When X is oxygen, the semiconducting material may be considered a bioxadiazole material.

Each Ar moiety may be a divalent moiety selected from

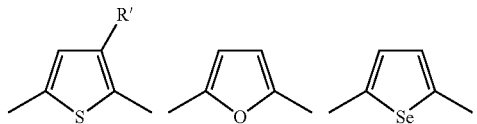

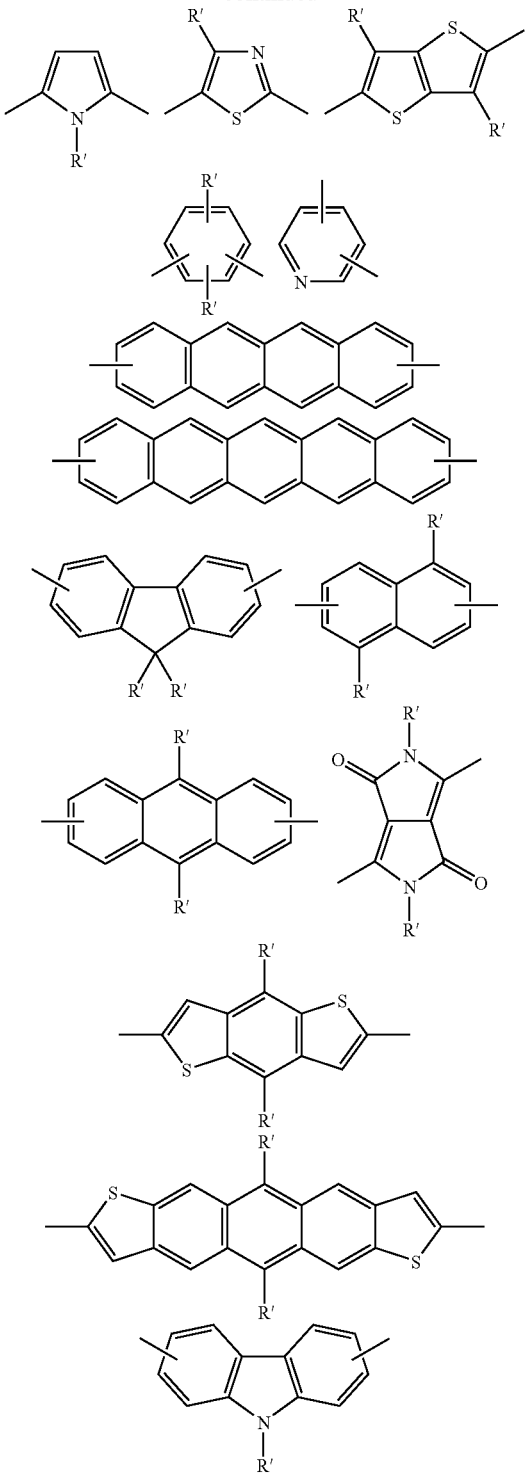

and combinations thereof, wherein R' is independently selected from hydrogen, alkyl, substituted alkyl, aryl, substituted aryl, heteroaryl, —CN, and the like, or mixtures thereof. In specific embodiments, R' is alkyl. The conjugated divalent moiety Ar may be substituted peripherally once, twice, or multiple times where applicable, with alkyl, substituted alkyl, aryl, substituted aryl, heteroaryl, halogen, —CN, —NO$_2$, and the like, or mixtures thereof. It should be noted that "Ar" denotes the presence of a moiety, while "a" denotes the number of moieties. In other words, there may be different Ar moieties, as will be seen further herein.

In some embodiments, Ar may be

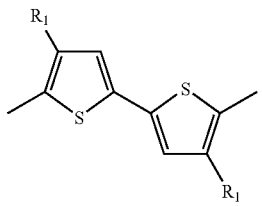

wherein $R_1$ is an alkyl group having 1 to about 18 carbon atoms, or an aryl or a heteroaryl group having from about 5 to about 20 carbon atoms. With reference to the meaning of Ar, here a=2. Both Ar moieties are a thiophene with one sidechain, but the $R_3$ sidechain is on the 3-carbon on one thiophene and on the 4-carbon on the other thiophene.

In other particular embodiments, each Ar moiety is independently selected from

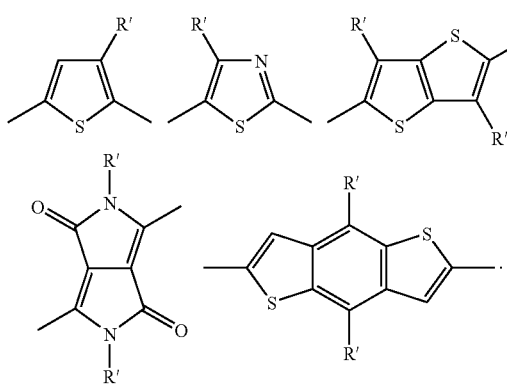

In particular embodiments the semiconducting polymer has a LUMO of 3.5 eV or less against vacuum. In more specific embodiments, the semiconducting polymer has a LUMO of 4.0 eV or less, or 4.5 eV or less, against vacuum.

In the embodiments the semiconducting polymer is an n-type semiconductor. In other words, the semiconducting polymer can transport electrons.

In other embodiments, the semiconducting polymer is both an n-type and a p-type semiconductor. That is, the semiconducting polymer can transport both electrons and holes.

The resulting semiconducting polymer may have a weight average molecular weight of from about 1,000 to about 1,000,000, or from about 5000 to about 100,000.

In particular embodiments the semiconducting polymer is selected from formulas (1) through (32):

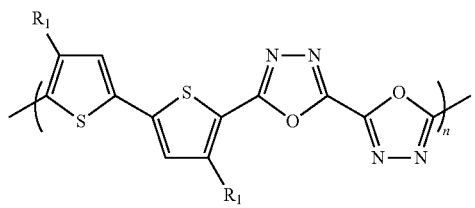

(1)

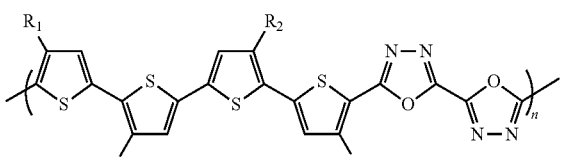

(2)

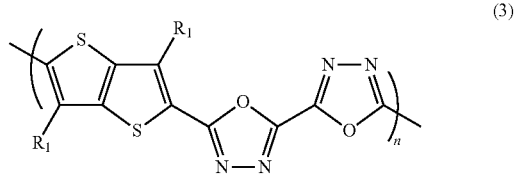

(3)

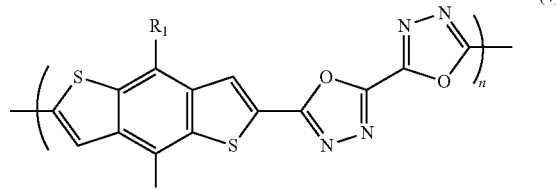

(4)

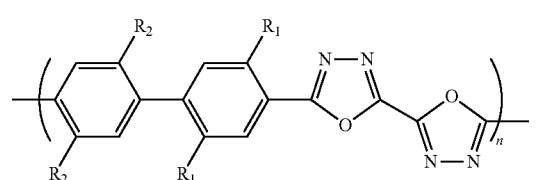

(5)

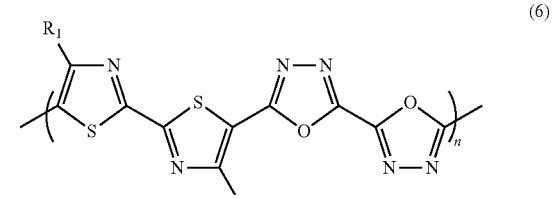

(6)

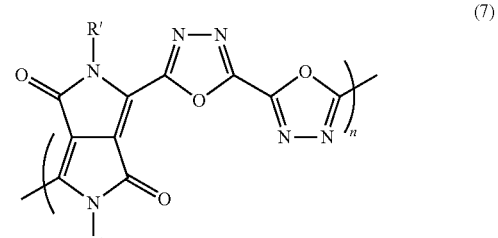

(7)

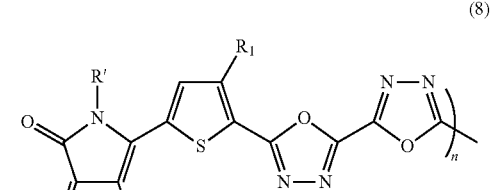

(8)

-continued
(9)
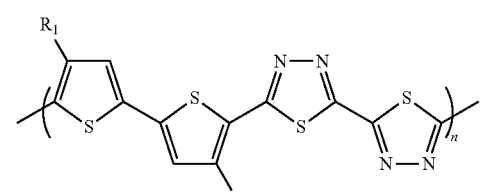
(10)
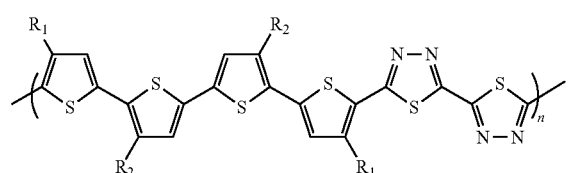
(11)
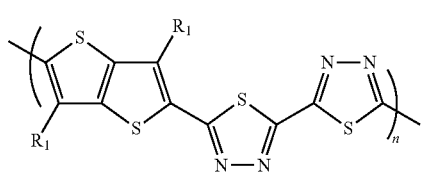
(12)
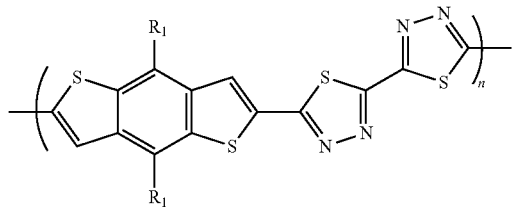
(13)
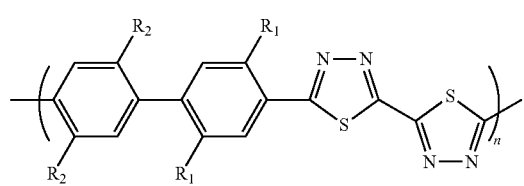
(14)
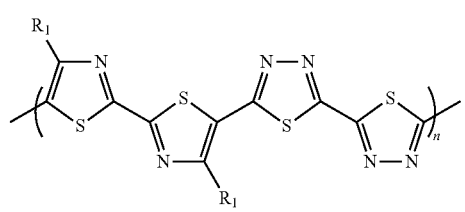
(15)
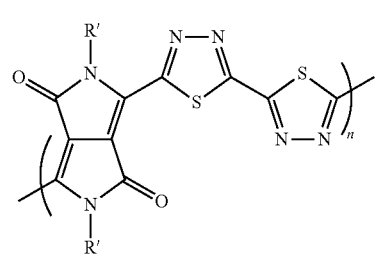
-continued
(16)
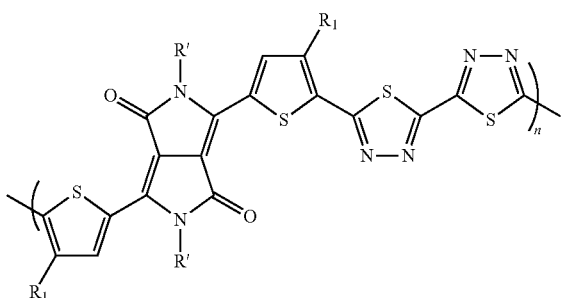
(17)
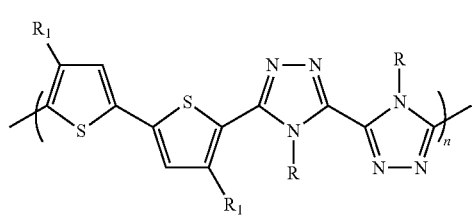
(18)
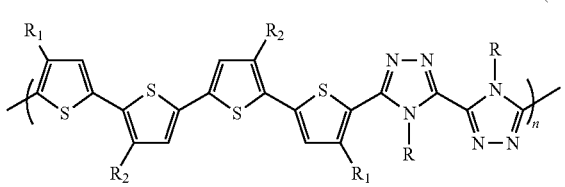
(19)
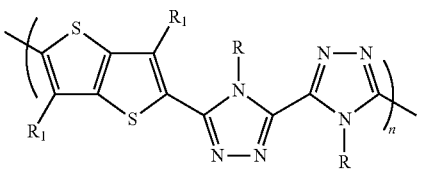
(20)
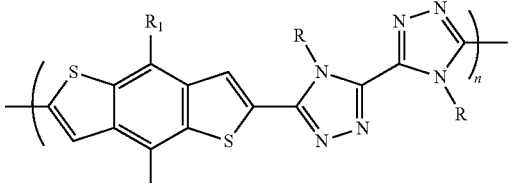
(21)
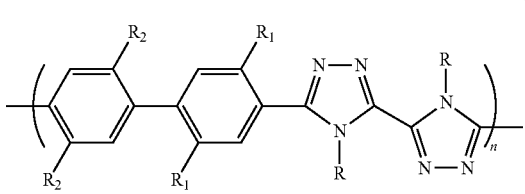
(22)
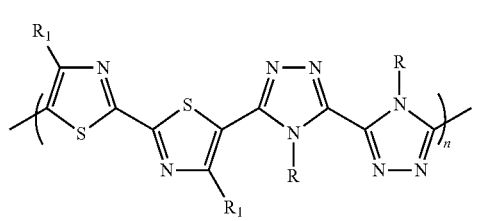

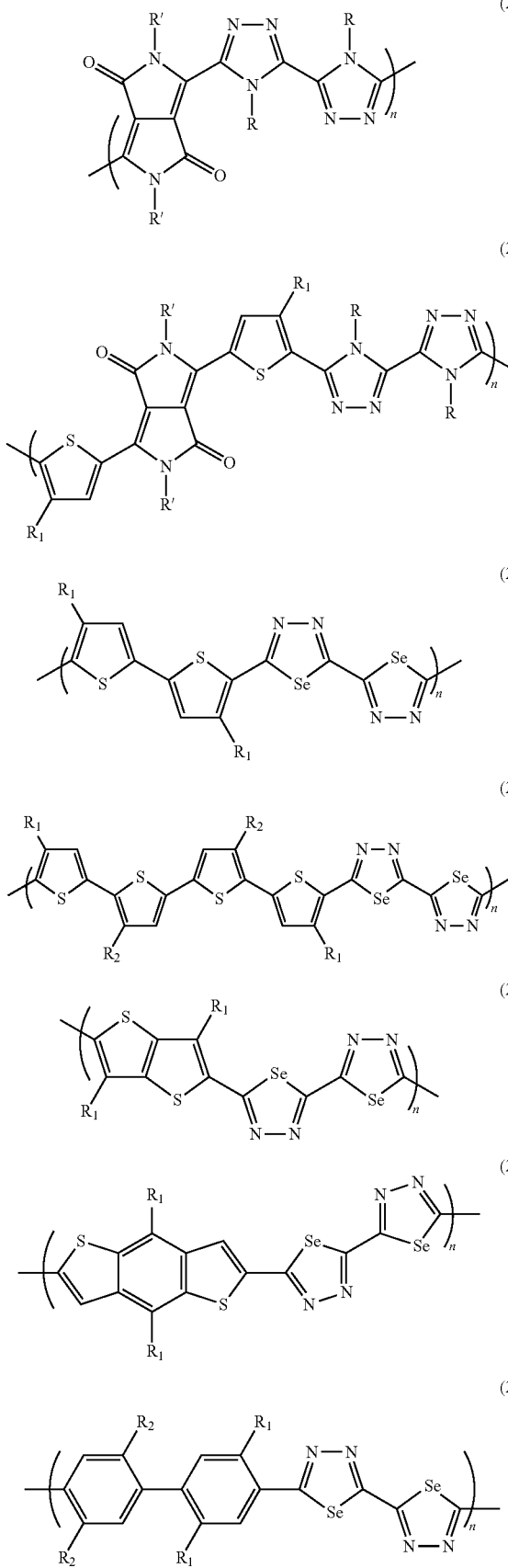
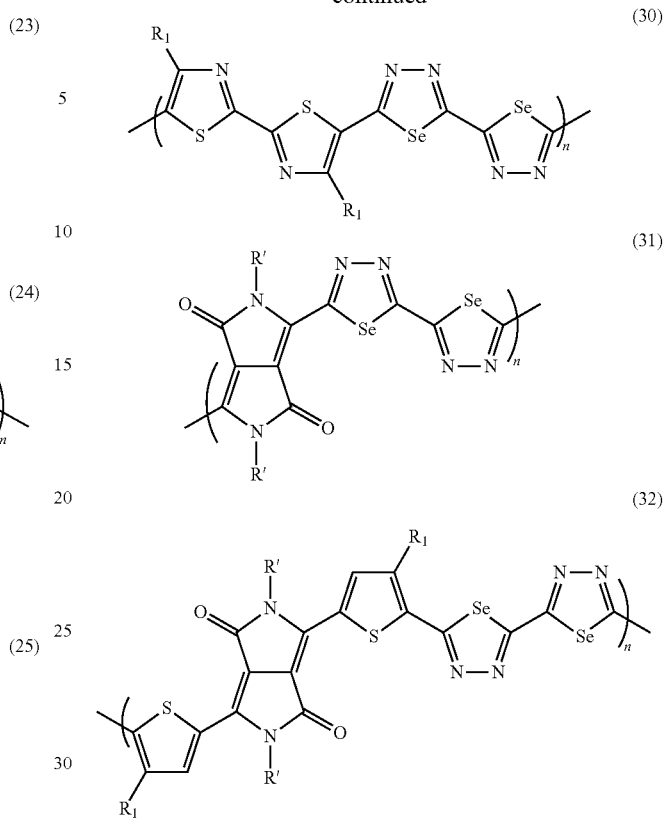

wherein R, R', $R_1$, and $R_2$ are independently selected from hydrogen, alkyl, substituted alkyl, aryl, substituted aryl, heteroaryl, —CN, and the like, or mixtures thereof. In specific embodiments, R' is alkyl. In other specific embodiments, $R_1$ is different from $R_2$.

Again, with reference to the meaning of Ar, in formula (32), a=3. Two of the Ar moieties are a thiophene with one sidechain (again attached to different carbons), and the third moiety is a diketopyrrolopyrrole.

The semiconducting polymers of the present disclosure are suitable as n-type semiconductors. The 1,3,4-heterodiazole moiety of these polymers is a strong electron-withdrawing moiety, which lowers the LUMO of the resulting semiconducting polymer. The biheterodiazole moiety should have a stronger electron accepting capability than a monoheterodiazole moiety. In addition, as seen below in the figure which numbers the positions, the biheterodiazole moiety forms polymers through the 5 and 5' positions.

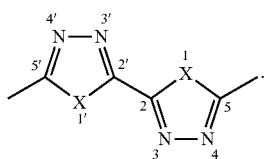

As a result, the bonds formed at the 5 and 5' positions are substantially parallel to each other. This allows the resulting polymer chain to be linear and consequently increases the order of molecular packing in the solid state. This linear structure also results in less steric repulsion between the two heterodiazole rings and the adjacent conjugated units connected to them. This allows the backbone of the polymer to be highly coplanar, which again allows for highly ordered molecular packing via intermolecular pi-pi interaction.

If desired, the semiconducting layer may further comprise another organic semiconductor material. Examples of other organic semiconductor materials include but are not limited to acenes, such as anthracene, tetracene, pentacene, and their substituted derivatives, perylenes, fullerenes, oligothiophenes, other semiconducting polymers such as triarylamine polymers, polyindolocarbazole, polycarbazole, polyacenes, polyfluorene, polythiophenes and their substituted derivatives, phthalocyanines such as copper phthalocyanines or zinc phthalocyanines and their substituted derivatives.

The semiconducting layer is from about 5 nm to about 1000 nm thick, especially from about 10 nm to about 100 nm thick. The semiconducting layer can be formed by any suitable method. However, the semiconducting layer is generally formed from a liquid composition, such as a dispersion or solution, and then deposited onto the substrate of the transistor. Exemplary deposition methods include liquid deposition such as spin coating, dip coating, blade coating, rod coating, screen printing, stamping, ink jet printing, and the like, and other conventional processes known in the art.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite or silver colloids. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

If desired, an interfacial layer may be placed between the dielectric layer and the semiconducting layer. As charge transport in an organic thin film transistor occurs at the interface of these two layers, the interfacial layer may influence the TFT's properties. Exemplary interfacial layers may be formed from silanes, such as those described in U.S. patent application Ser. No. 12/101,942, filed Apr. 11, 2008.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconducting layer should both be in contact with the dielectric layer. In addition, the source and drain electrodes should both be in contact with the semiconducting layer. The semiconducting polymer formed by the methods of the present disclosure may be deposited onto any appropriate component of an organic thin-film transistor to form a semiconducting layer of that transistor.

The resulting transistor may have, in embodiments, a mobility of 0.01 cm$^2$/V·sec or greater.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An electronic device comprising a semiconducting layer, wherein the semiconducting layer comprises a semiconducting polymer of Formula (I):

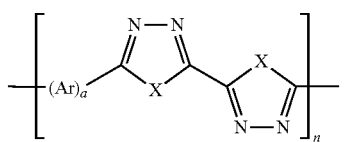

Formula (I)

wherein X is independently selected from S, Se, O, and NR, wherein R is independently selected from hydrogen, alkyl, substituted alkyl, aryl, substituted aryl, heteroaryl, and —CN;

a is an integer from 1 to about 10;

n is an integer from 2 to about 5,000; and each Ar is a conjugated divalent moiety selected from:

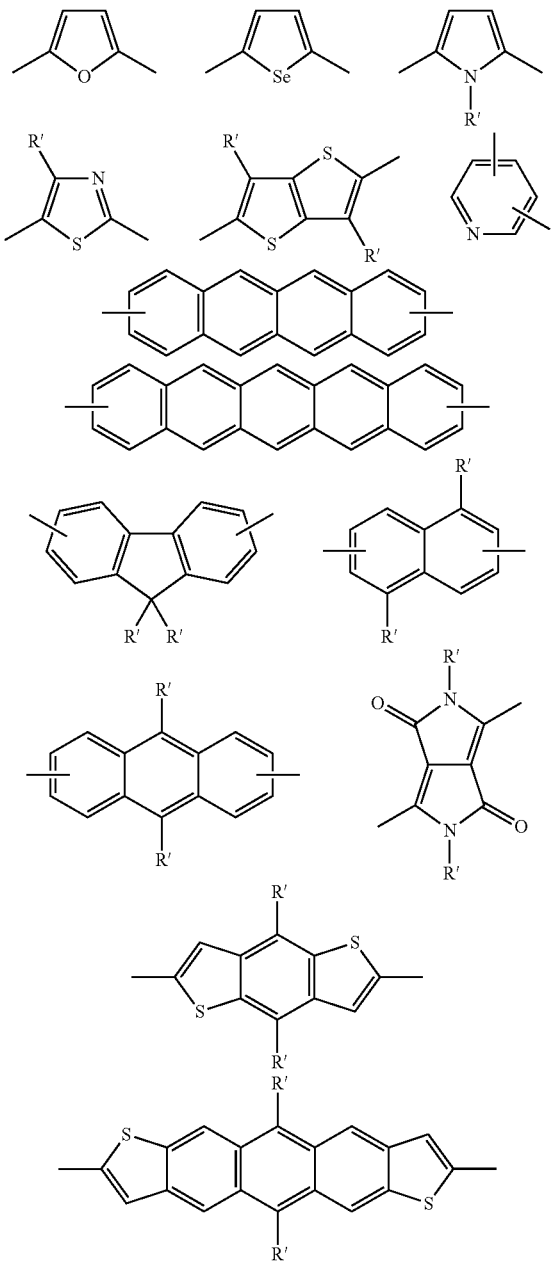

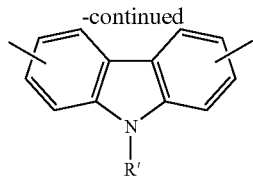

and combinations thereof, wherein R' is independently selected from hydrogen, alkyl, substituted alkyl, aryl, substituted aryl, heteroaryl, or —CN; and the divalent moiety may be substituted peripherally with alkyl, substituted alkyl, aryl, substituted aryl, heteroaryl, halogen, —CN, or —NO$_2$.

2. The electronic device of claim 1, wherein X is independently selected from S and O.

3. The electronic device of claim 1, wherein each X is O.

4. The electronic device of claim 1, wherein the semiconducting polymer has a LUMO of 3.5 eV or less.

5. The electronic device of claim 1, wherein the semiconducting polymer has a LUMO of 4.0 eV or less.

6. The electronic device of claim 1, wherein the semiconducting polymer has a LUMO of 4.5 eV or less.

7. The electronic device of claim 1, wherein the semiconducting polymer is an n-type semiconductor.

8. The electronic device of claim 1, wherein the semiconducting polymer is both an n-type and a p-type semiconductor.

9. The electronic device of claim 1, wherein the semiconducting polymer has a weight average molecular weight of from about 1,000 to about 1,000,000.

10. The electronic device of claim 1, wherein the semiconducting polymer has a weight average molecular weight of from 5000 to about 100,000.

11. The electronic device of claim 1, wherein the electronic device is a thin film transistor.

12. An electronic device comprising a semiconducting layer, wherein the semiconducting layer comprises a semiconducting polymer of Formula (I):

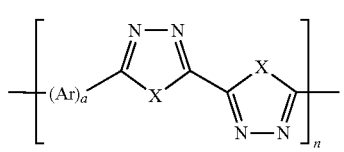

Formula (I)

wherein X is independently selected from S, Se, O, and NR, wherein R is independently selected from hydrogen, alkyl, substituted alkyl, aryl, substituted aryl, heteroaryl, and —CN, each Ar is independently selected from:

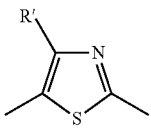 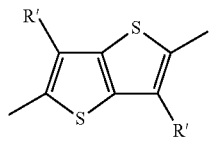

-continued

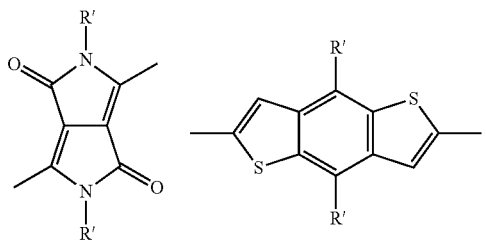

wherein R' is independently selected from hydrogen, alkyl, substituted alkyl, aryl, substituted aryl, heteroaryl, and —CN;

a is an integer from 1 to about 10; and n is an integer from 2 to about 5,000.

13. The electronic device of claim 12, wherein X is independently selected from S and O.

14. The electronic device of claim 12, wherein the electronic device is a thin film transistor.

15. An electronic device comprising a semiconducting layer, wherein the semiconducting layer comprises a semiconducting polymer of Formula (1):

Formula (1)

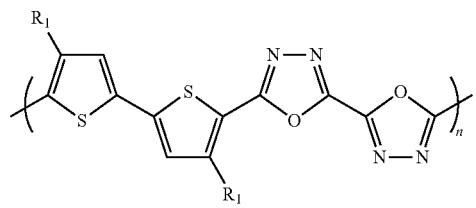

wherein $R_1$ is an alkyl group having 1 to about 20 carbon atoms, or an aryl or a heteroaryl group having from about 5 to about 20 carbon atoms.

16. The electronic device of claim 15, wherein the semiconducting polymer is Formula (1):

Formula (1)

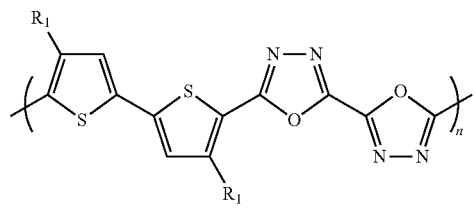

wherein $R_1$ is selected from alkyl having about 4 to about 20 carbon atoms.

17. An electronic device comprising a semiconducting layer, wherein the semiconducting layer comprises a semiconducting polymer, wherein the semiconducting polymer is selected from the group consisting of formulas (1), (3), (4), (6) through (9), (11) through (17), (19) through (25), and (27) through (32):

(1)
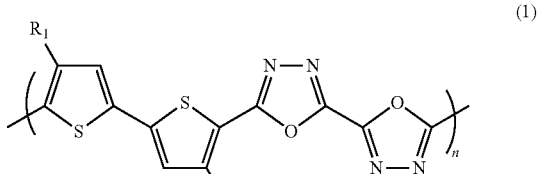

(3)
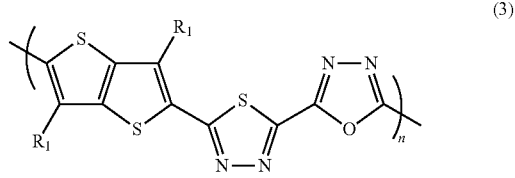

(4)
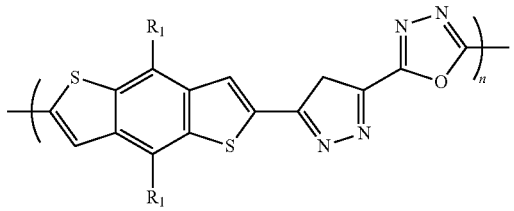

(6)
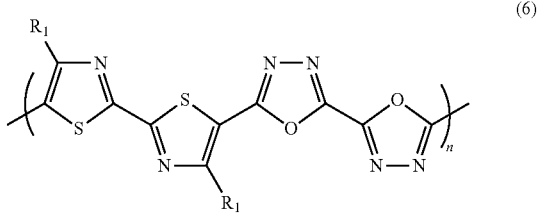

(7)
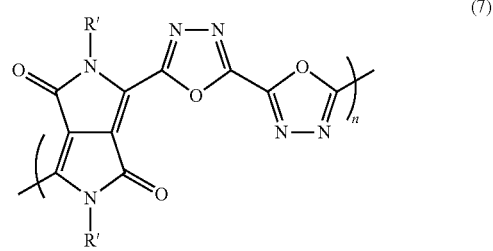

(8)
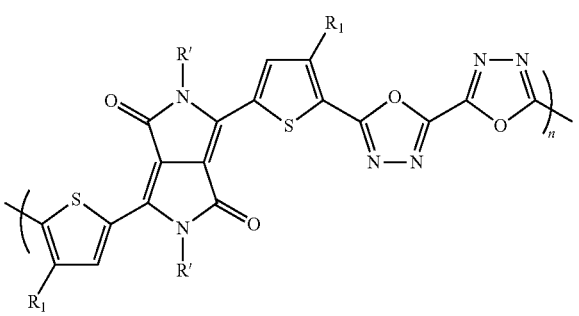

(9)
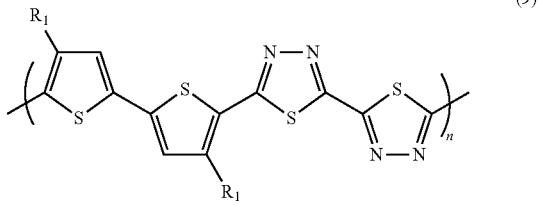

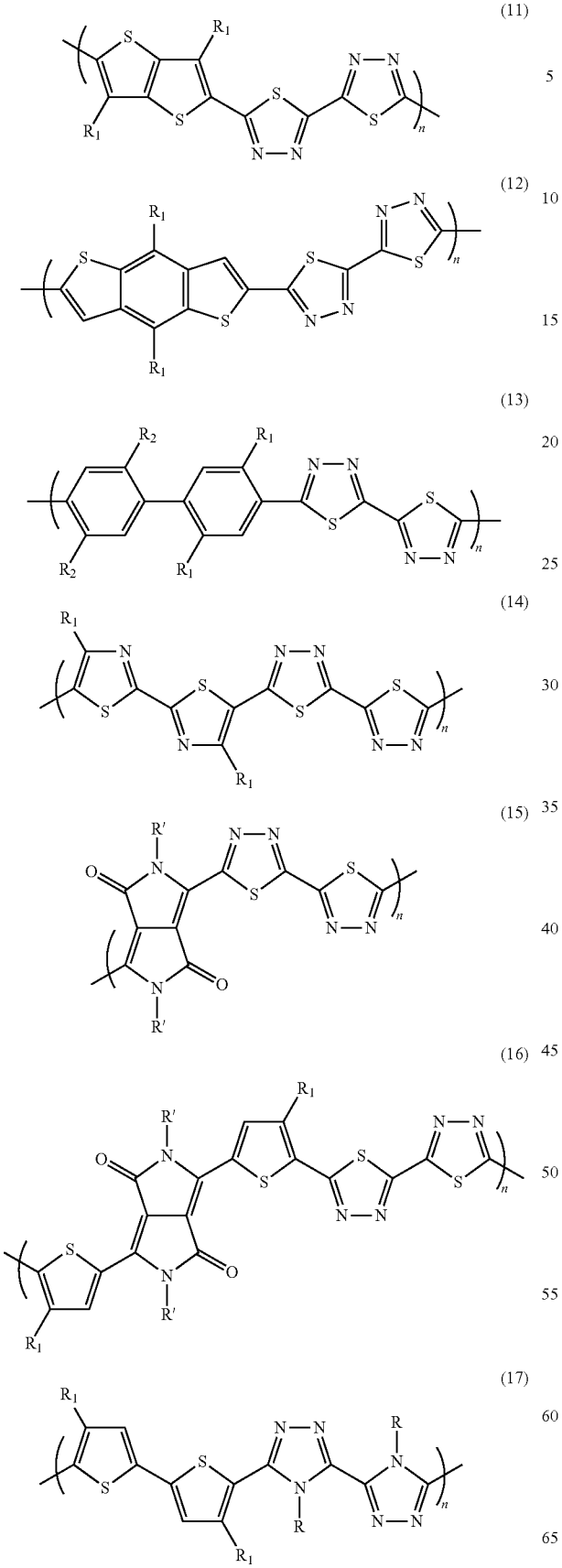
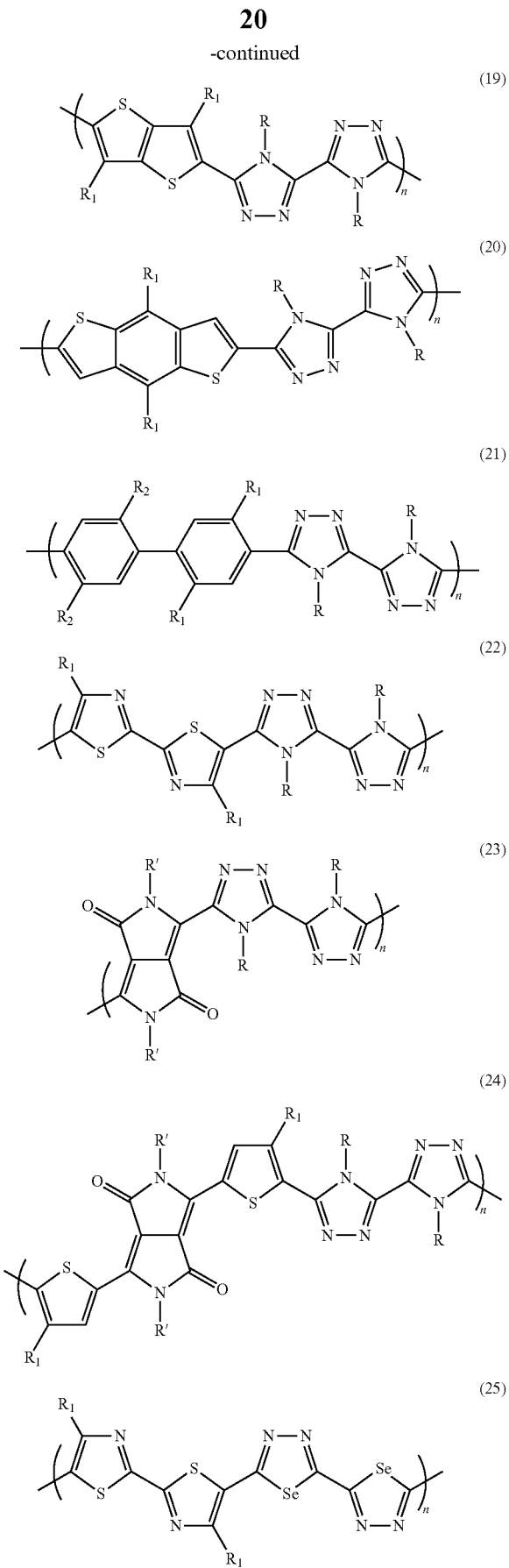

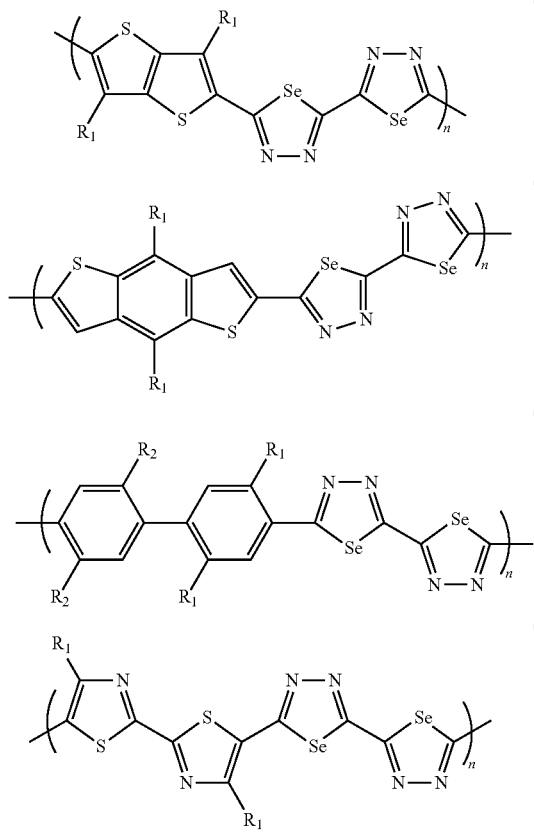
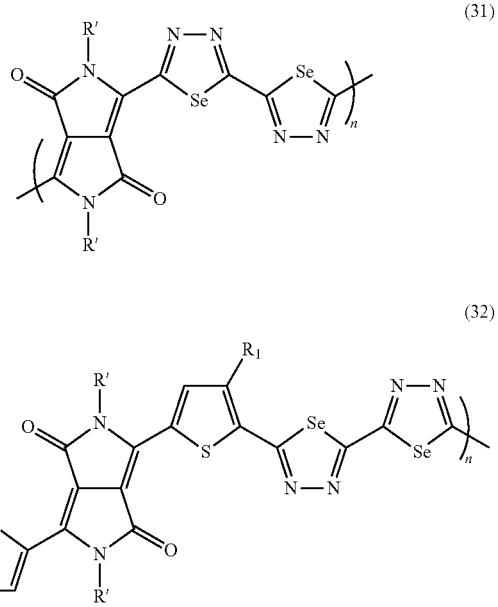
wherein R, R', $R_1$, and $R_2$ are independently selected from hydrogen, alkyl, substituted alkyl, aryl, substituted aryl, heteroaryl, —CN, or mixtures thereof.
* * * * *